United States Patent [19]
Chakradhar et al.

[11] Patent Number: 5,461,573
[45] Date of Patent: Oct. 24, 1995

[54] VLSI CIRCUITS DESIGNED FOR TESTABILITY AND METHODS FOR PRODUCING THEM

[75] Inventors: Srimat T. Chakradhar, No. Brunswick; Suman Kanjilal, New Brunswick; Vishwani Agrawal, Murray Hill, all of N.J.

[73] Assignees: NEC USA, Inc., Princeton; Rutgers University, New Brunswick, both of N.J.; AT&T Corp., New York, N.Y.

[21] Appl. No.: 123,883

[22] Filed: Sep. 20, 1993

[51] Int. Cl.⁶ .................................... H01L 21/82
[52] U.S. Cl. .................. 364/489; 364/488; 364/490; 364/491
[58] Field of Search .................. 364/488, 489, 364/490, 491; 371/22.1, 22.3, 22.5, 22.6

[56] References Cited

U.S. PATENT DOCUMENTS

| | | | |
|---|---|---|---|
| 5,132,974 | 7/1992 | Rosaks | 371/22.3 |
| 5,222,030 | 6/1993 | Dangelo et al. | 364/489 |
| 5,228,040 | 7/1993 | Agrawal et al. | 371/22.1 |
| 5,257,268 | 10/1993 | Agrawal et al. | 371/27 |
| 5,321,277 | 6/1994 | Sparks et al. | 257/48 |

*Primary Examiner*—Kevin J. Teska
*Assistant Examiner*—Stephen J. Walder, Jr.
*Attorney, Agent, or Firm*—Arthur J. Torsiglieri

[57] ABSTRACT

A VLSI circuit including memory is viewed as a finite state object machine and for testability a finite state test machine is embedded in the finite state object machine. To make the embedding practiced, the object test machine is partitioned into components and separate test machines are embedded into each component. The augmented components are then interconnected to form a composite machine for testing. To have the same test generation complexity as the object machine with a single embedded test function, there are special relations that have to be satisfied in the manner in which the test machines are embedded.

10 Claims, 9 Drawing Sheets

14(a)                    14(b)

VLSI CIRCUITS DESIGNED FOR TESTABILITY AND METHODS FOR PRODUCING THEM

FIELD OF INVENTION

This invention relates to the manufacture of VLSI (Very Large Scale Integrated) circuits and, more specifically to the manufacture of such circuits in which provision for testing is included and to circuits so manufactured.

BACKGROUND OF THE INVENTION

As VLSI circuits have become both more dense and more complex, they have become increasingly difficult to test.

In particular, the inability to access internal nodes of a VLSI circuit because of the density and microscopic size of the circuit components has made it necessary to test such circuits only; by accessing the input and output terminals of the circuit chip. Usually this is done by applying a set of vectors as an input to the circuit and looking for an appropriate set of outputs. While this technique is useful for some types of VLSI circuits it tends not to be particularly useful with sequential circuits, which are circuits with memory elements or registers, and in which an earlier state of the circuit is important to the final state. Such sequential circuits can be represented as finite state machines. In such circuits, it is advantageous to make certain memory elements controllable and observable for reliable testing, advantageously by testing in the manner of a combinational test circuit.

One established method is to insert scan hardware after the desired functional circuit has been synthesized. In this technique, critical memory elements whose performance is to be observed are provided with auxiliary circuitry that is normally dormant but that is activated on command to interconnect the critical memory elements into a shift register that is then scanned so that the performance of individual memories can be observed. This full scan technique has the disadvantage that it tends to require considerable additional circuitry that consumes valuable space that might otherwise have been used for the functional circuit. Although there have been modifications of this approach to provide partial scan, at the expense of reduced reliability, this has not always been a completely satisfactory solution to the problem.

A more recent trend has been to consider testability during the logic synthesis of the circuit. This technique has been described in a paper entitled "Finite State Machine Synthesis with Embedded Test Function," Journal of Electronic Testing: Theory and Applications, Vol. 1 pp. 221–228 (1990). It has also been the subject of U.S. Pat. No. 5,228,040 which issued on Jul. 13, 1993, filed by V. D. Agrawal and K. T. Cheng who also authored the identified paper.

This approach involves the selected incorporation of a test function into the state diagram of the finite state machine appropriate for the desired VLSI circuit. For testing, the augmented state diagram is then implemented as the desired functional circuit and the test function is used to test the entire circuit. There are usually several choices for the test function and several ways in which a chosen test function can be incorporated into the state diagram of a finite state machine and these choices can have a significant impact on the area and performance of the final implementation.

In particular, the incorporation of the test function or a test machine into the object finite state machine, hereinafter more simply the object machine, can become complex when the object machine has a significant number of states. In general, for n states of the test machine there are n! ways of embedding the test function into the object machine when a new input is added, because each object machine state can be mapped onto any one of the n states. Moreover, the area overhead can be higher than that of full scan unless the states of the state machine are mapped efficiently onto the states of the object machine. In particular, it is advantageous if the test machine can be embedded into the object machine without the need for an additional input line, although this is not usually the case. Additionally, for a complicated functional VLSI circuit, such as one that might involve hundreds or thousands of memory elements, the design of an appropriate finite state machine for the entire circuit becomes so formidable a project as usually to prove impractical.

SUMMARY OF THE INVENTION

The present invention relates to improvements in this prior art technique of incorporating the test function into the state diagram of the finite state machine for testability of a VLSI circuit.

The invention has two separate features. A first feature is an improved technique for embedding a test function or test machine into an object machine for achieving an augmented or composite finite state machine that can then be implemented as an appropriate testable VLSI circuit which a test signal is applied to it. When possible the test function is embedded in the augmented machine without adding an input line. When this is not possible, the more common case, one or more extra input lines are added. For the extra inputs case, partition theory and the state variable dependencies of the object machine are used to obtain a mapping of the test machine states onto the object machine state. Embedding a test machine involves finding a mapping of the states, input symbols and output symbols of the test machine onto the states, input symbols and output symbols of the object machine, as will be described more fully later.

The second feature of the invention relates to an improved methodology for testing that takes advantage of the special property of a finite state machine that it can generally be decomposed into a collection of smaller machines connected in series. A machine with $2^k$ states can be split into two series connected machines consisting of $2^i$ and $2^{k-i}$ states for o<i>k. More particularly, this second feature of the invention involves treating the object machine as an interconnection of a number of smaller machines and embedding a separate test machine into each component machine of the interconnection in a manner to retain the same test generation capabilities as the object machine with a single embedded test machine. This makes it possible to reduce the number of states needed to test the object machine to a practicable figure.

Typically, the fabrication of a VLSI sequential circuit including testability in accordance with the invention proceeds as follows. First, after the functional role of the VLSI circuit has been specified and a gate level design of the function has been decided, the gate level design is partitioned into smaller components. Generally, it is desirable to limit each component to a maximum of about ten flip flops so that a state diagram of such component can be readily prepared in known fashion. There is then chosen for each component a test state diagram that is appropriate for mapping to the state diagram of the component. In particular, it is important that the dependency graph of the object machine component have state variables which map on to the state variables of the test machine dependency graph so that the dependency among the state variables does not increase. The result of the mapping is a composite machine state transition graph. A gate level implementation of this graph, when fabricated, can be operated to serve selectively either as the functional circuit component test circuit component.

Since each composite component is not directly observable, it is also necessary that in the test mode the test components are interconnected to form an interconnection machine, typically a shift register, such that the state of each memory element in such test component can be set as desired by signals introduced at an input terminal.

For the interconnection machine to work properly, certain relationships need to be satisfied between the connecting portions. To this end, the interconnected machine is first represented as a directed graph with one vertex for every component M of the object, machine. There is an edge from vertex $M_i$ to vertex $M_j$ if an output of component machine $M_i$ is also an input of component machine $M_j$. There is then formed a continuous chain consisting of all vertices in the graph of the interconnected machine, adding edges as necessary. Next there is added an input line common to all component machines and then a separate test machine is embedded in each component machine, such that the output symbols of the test machine associated with component machine $M_i$ are the input symbols of the test machine corresponding to the immediate successor machine of machine $M_i$ in the chain that was previously formed. The resulting augmented machine is finally implemented as a VLSI circuit and provision would be included to operate the circuit selectively either in its functional mode or in the test mode in the usual fashion, as is discussed in the aforementioned patent.

In instances where it is impractical to form a gate level implementation of the object machine before the embedding of the finite state machine, the dependency graphs needed can be formed from a netlist description of the object machine.

The invention will be better understood from the following more detailed description taken with the accompanying drawing.

DETAILED DESCRIPTION OF THE DRAWINGS

It will be helpful to begin with a review of the concept of test function and its embedding into an object machine described in the earlier identified Agrawal and Cheng patent.

Figure 1:
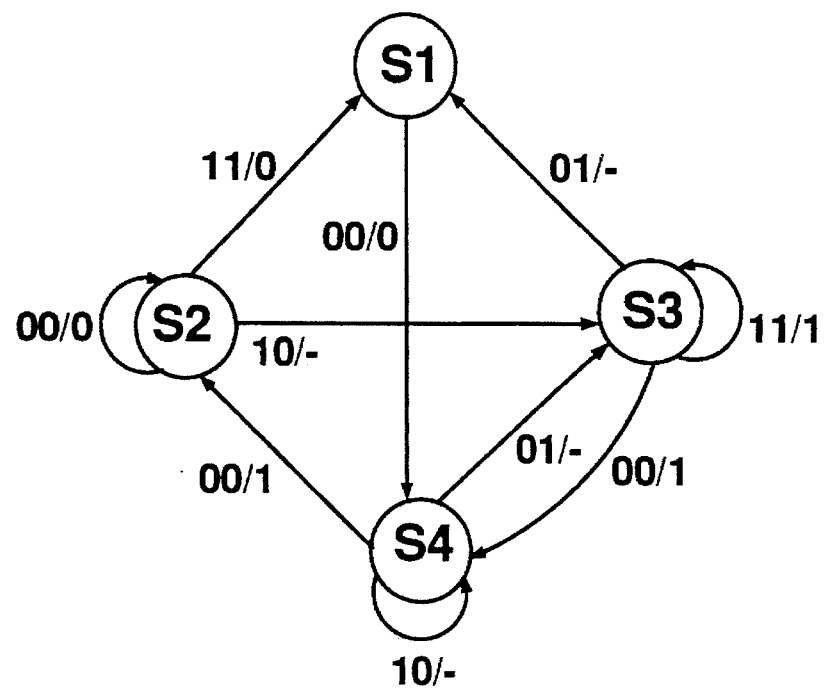
FIGS. 1, 2 and 3 show state diagrams of an object finite state machine, a test finite state machine, and a composite finite state machine formed by embedding a test function in an object machine, respectively.

Consider an object machine which, in accordance with established practice, is represented by its standard state transition diagram 10 shown in FIG. 1. It will be convenient hereinafter to usually refer to such state transition diagrams as the finite state machines they represent. It has four states, $S_1$–$S_4$, two primary input lines and one output line. Minimum length state encoding requires $[\log_2 4]$ or two state variables. We are to augment this object machine by a test function to provide easy testability. The test function to be used is a finite state machine called the test machine that performs two functions: it can be set to all of its states by short predetermined sequences, and any states can be observed at the output by applying a short input sequence. The test machine is to use the same state variables as the object machine.

Figure 2:
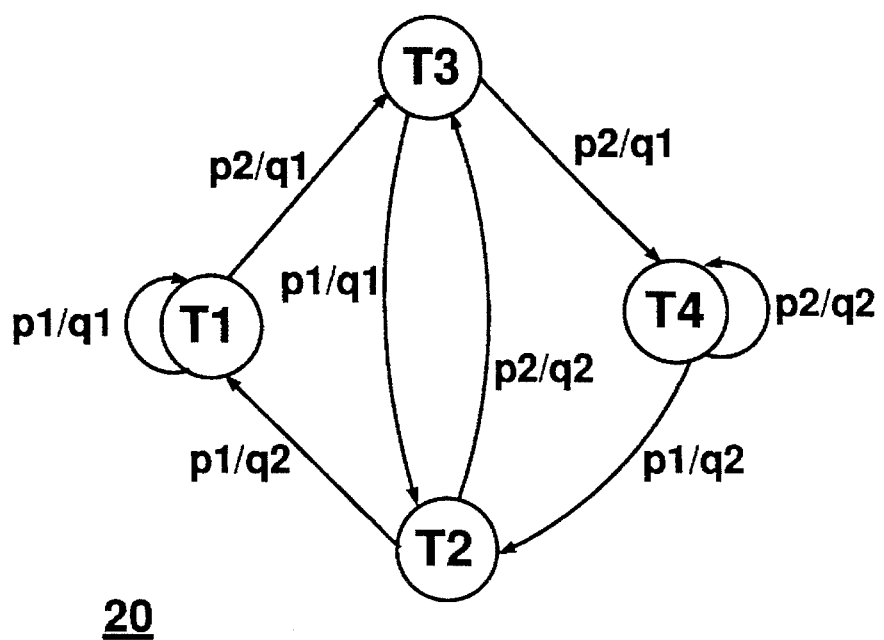
Figure 3:
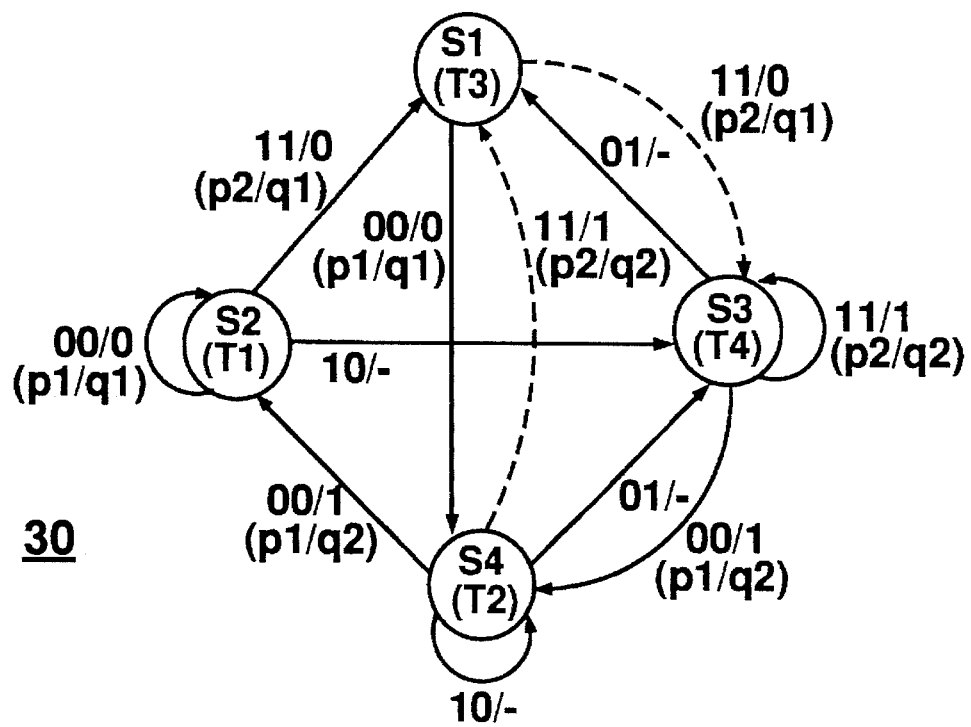

A possible test machine 20 is given in FIG. 2. This machine has four states $T_1$–$T_4$, two input symbols ($p_1$ and $p_2$) and two output symbols ($q_1$ and $q_2$). It is easily verified that this machine can be set to any desired state by an input sequence of two vectors. Furthermore, its output sequence uniquely depends upon the initial state when a sequence of length two consisting of the symbols $p_1$ and $p_2$ taken in any order is applied. In general, for n states and two input symbols, the length of these sequences will be $[\log_2]$. Assume that the state diagram of the test machine is then merged with the state diagram of the object machine such that the augmented or composite machine contains a minimum number of transitions added to the object machine. FIG. 3 illustrates one possible form 30 of such a composite machine. Extra transitions not contained in the object machine are indicated by dotted lines. States $T_1$, $T_2$, $T_3$ and $T_4$ of the test machine are mapped onto states $S_2$, $S_4$, $S_1$ and $S_3$, respectively. Input symbols $p_1$ and $p_2$ of the test machine are assigned the codes 00 and 11. Similarly, output symbols $q_1$ and $q_2$ are assigned the codes 0 and 1, respectively.

Figure 4:
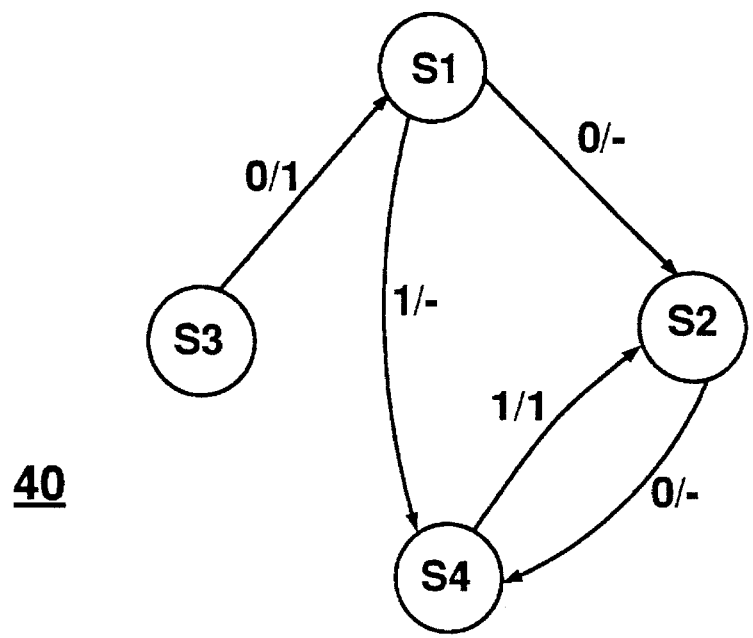
FIG. 4 is the state diagram of an object machine that is incompatible with a test machine.

The composite machine can be obtained by a graph embedding procedure. If the object machine graph does not have a subgraph that is isomorphic to the test machine graph, then a one-to-one mapping between the states of the test machine and the object machine is impossible. Such a test machine would be incompatible with the object machine. For example, consider the object-machine 40 in FIG. 4. It can be easily verified that the test machine graph of FIG. 2 is incompatible with this graph. However, if we add an extra input to the object machine, then the number of possible transitions in the object machine is doubled and we can embed the test machine. The new input line may be assigned a value 1 for the new transitions added to the object machine. It will then assume a value 0 for the transitions that belong to the original object machine. One possible embedding of the test machine 20 of FIG. 2 into the object machine 40 of FIG. 4 is as follows: states $T_1$, $T_2$, $T_3$ and $T_4$ of the test machine are mapped onto states $S_1$, $S_2$, $S_3$ and $S_4$, respectively, of the object machine.

Testing of the composite machine is performed in two stages. In the first stage, the operation of the test machine is verified by setting and observing each memory element to the 0 and 1 states and performing fault simulation of the entire circuit. In the second stage, only faults not detected in the first stage are considered. A combinational test generator determines the inputs and the present state required to propagate the fault to a primary output or next state line. The test vector is converted to a test sequence by appending in turn a synchronizing sequence to insure that machine is put in a required present state and a distinguishing sequence for propagating the faulty state to primary outputs.

The embedding problem when a state transition graph is available can be stated as follows:

There will later be considered the case when such a graph is not readily available.
1. Is it possible to add unspecified transitions to the object machine state transition graph forming a subgraph that is isomorphic to the test machine state transition graph? If yes, find the subgraph.
2. If an extra input line must be added to the object machine, what is the best way of specifying the new transitions forming a subgraph in the object machine that is isomorphic to the test machine graph such that the area of the composite machine is minimized?

It is possible to embed the test machine if the object machine contains a subgraph that is isomorphic to the test machine. Note that if the object machine is incompletely specified (a machine is incompletely specified when some transitions out of a state are not specified), we can use the unspecified edges to embed the test machine. Embedding a test machine involves finding a mapping of the states, input symbols and output symbols of the test machine onto the states, input symbols and output symbols of the object machine.

First, we provide a technique which finds an embedding of the test machine onto the object machine without adding a new input line. We assume that the object machine is completely specified (i.e., every transition out of every state has been specified).

Figure 5:
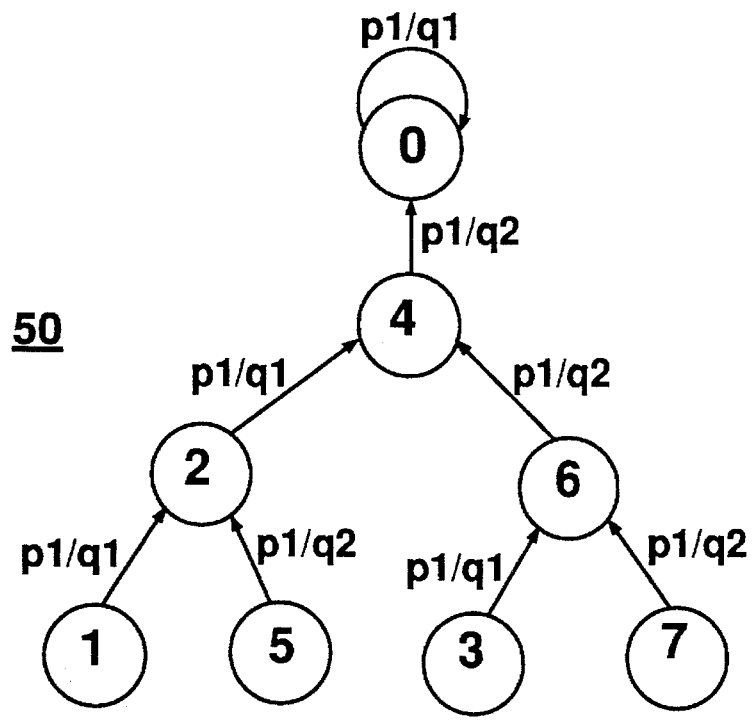
FIGS. 5 and 6 are different subgraphs of a test machine.
Figure 6:
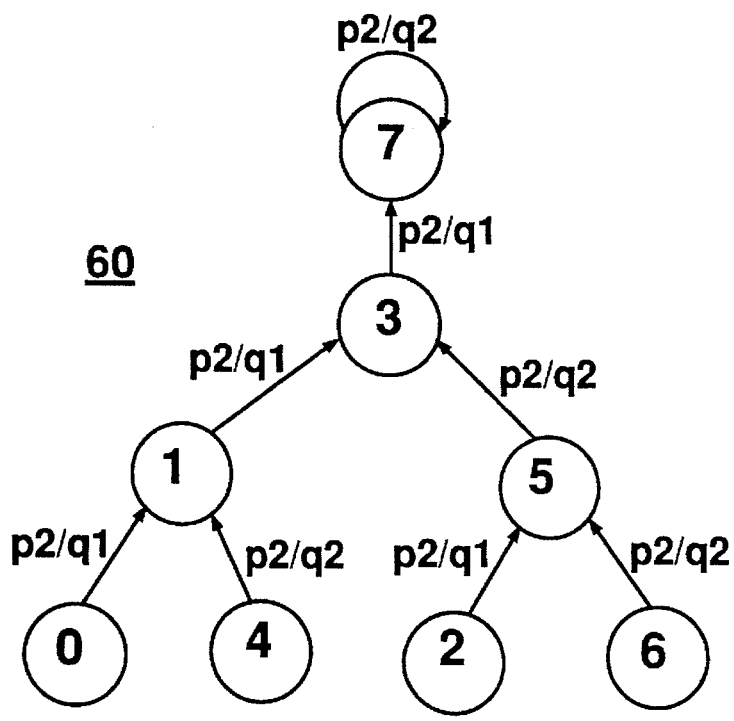

Consider a test machine consisting of two input symbols $p_1$ and $p_2$, two output symbols $q_1$ and $q_2$, and eight states that are numbered 0, 1, . . . , 7. Like the four-state test machine 20 of FIG. 2, the eight-state machine also has two states 0 and 7 with self-loops. The subgraphs 50 and 60 of the test machine induced by the edges labeled $p_1$ and $p_2$ are shown in FIGS. 5 and 6, respectively. We note several special properties of these subgraphs. Consider the subgraph 50 induced by $p_1$. Every state has one outgoing edge. Even numbered states have two incoming edges. An even numbered state s has one incoming edge from the state $s/2$ and the other incoming edge is from the state $$\frac{s+m}{2}.$$

Therefore, the subgraph induced by $p_1$ is a complete binary tree with the edge's pointing upwards. The root points to the state that has a self loop. The subgraph induced by $p_2$ also has similar properties. However, every odd numbered state s has two incoming edges from states $$\lfloor \frac{s}{2} \rfloor \text{ and } \lfloor \frac{s+m}{2} \rfloor.$$

Leaves (internal nodes) in one subgraph are internal nodes (leaves) of the other subgraph.

Our novel algorithm for embedding for the case when all transitions in the object machine are explicitly specified consists of the following steps.

Algorithm A:
1. Pick two untried combinations of input symbols $I_1$ and $I_2$ of the object machine. If all input combinations have been tried out, it is not possible to embed without adding an extra input line.
2. Find subgraphs of the object machine induced by $I_1$ and $I_2$. Let the subgraphs be $G_1$ and $G_2$, respectively. If both $G_1$ and $G_2$ are complete binary trees with their roots pointing to states that have a self loop, then proceed to the next step. Otherwise, go to Step 1.
3. Map the state with a self-loop in $G_1$ onto state 0 of the test machine. Also, map the root of $G_1$ onto the state $m/2$ of test machine. Map the state with a self-loop in $G_2$ onto state $m-1$. The root of $G_2$ is mapped onto state $$\frac{m}{2} - 1.$$

4. Consider a leaf in $G_1$ or $G_2$ that has been mapped onto some state in the test machine. The mapping of all successors of the leaf is determined as follows: the immediate successor of a state in $G_1$ ($G_2$) that has been mapped onto state s of test machine, must be mapped onto state 2s (2s+1) when 2s<m (2s+1<m). Otherwise it is mapped onto state 2s−m(2s+1−m) of the test machine. Ira successor of the leaf is already mapped onto a state that is inconsistent with the above rule, go to Step 1.
5. If all states of the object machine have been mapped onto some state of the test machine, then we have obtained an embedding. Otherwise go to Step 4.

Algorithm A embeds the test machine onto a completely specified object machine whenever there exists an embedding that does not require an additional input line.

When all leaves of both subgraphs $G_1$ and $G_2$ have been mapped, we get the mapping for all other states. This is because the mapping for all successors of a leaf is uniquely determined from the mapping of the leaf. If there is an inconsistency in the mapping of some successor of a leaf, then the subgraph $G_1 \cup G_2$ is not isomorphic to the test machine. If all nodes in $G_1 \cup G_2$ are mapped onto states in test machine, then graph $G_{\cup G2}$ is isomorphic to the test machine.

For the following discussion, we define the size of a machine to be the number of transitions E in the state transition graph of the machine.

The time complexity of Algorithm A is polynomial in the size of the description of the machine.

If i is the number of primary input lines, then Step 1 of Algorithm A outlined above, is repeated at most $2^{2i}$ times. Step 2 requires O(n) time where n is the number of states in the machine. Step 3 can be performed in constant time. Step 4 takes O(log n) time for each node in the graph $G_1$ or $G_2$. The total time complexity is $O(2^{2i} \cdot n \log n)$. Since the size of the machine is $n \cdot 2^i$, the algorithm has a polynomial time complexity.

It is possible that the number of transitions from a state in the description of the machine may be less than $2^i$ even if the machine is completely specified. As an example, consider a machine with four primary input lines. The input combination for a transition may be given as 1–01 instead of two separate transitions 1001 and 1101. The embedding algorithm can be modified as follows. Assume that E is the total number of transitions in the description of the machine and n is the number of states. Let the number of transitions from state $S_i$ be $E_i$. Thus, $E_1+E_2+\ldots+E_n=E$. We define the product of two transitions to be the maximal cube that is covered by both transitions. For example, the product of transitions 1-0- and 10-1 is 1001. Pick one transition $t_i$ from each state $S_i$ ($1 \leq i \leq n$). If the product of these transitions is empty, then pick another combination of transitions until we get a non-empty product. Let the non-empty product be $I_1$. Similarly, we pick another combination of transitions to obtain a second non-empty product $I_2$. We repeat Step 2 through Step 5 of the above algorithm to see if an embedding is possible with $I_1$ and $I_2$. Otherwise, we pick a different combination of $I_1$ and $I_2$. The number of possible combinations of $I_1$ and $I_2$ are $$\binom{E_1.E_2\ldots E_n}{2} \models O((E_1.E_2\ldots E_n)^2) = O\left(\left(\frac{E}{n}\right)^{2n}\right).$$

The complexity of Step 2 through Step 5 is $O(n \log n)$ and the time complexity of the modified algorithm is $$O\left((n \log n)\left(\frac{E}{n}\right)^{2n}\right).$$

If the object machine is incompletely specified, Step 2 produces subgraphs $G_1$ and $G_2$ with some unspecified edges. The solution then involves adding edges to $G_1$ and $G_2$ such that $G_1 \cup G_2$ is isomorphic to the state transition graph of the test machine. If a transition from a state is unspecified, we can specify the next state of the transition to be any one of the states of the object machine. Also, for incompletely specified machines, there may be input combinations that are unused. For these inputs, no state transitions are specified from any state in the object machine. Such input combinations can be used as $p_1$ or $p_2$. It can be shown that the problem of finding such input combinations, if they exist, is equivalent to the classical NP-complete problem of Boolean satisfiability. Therefore, solutions to this problem will necessarily be heuristic. Often the most practical approach will be to add an extra input line.

There are n! ways of embedding the test machine into the object machine (n is the number of states) when an extra input line is added. We are interested in the embedding that results in minimum logic overhead for the composite machine as compared to an implementation of the object machine. Trying out all n! embeddings is impractical. We propose a heuristic algorithm that works well in practice.

We map states of the test machine to states of the object machine such that the dependency among state variables does not increase. Our method is illustrated by the following example. For precise definition of dependency and partition, one may refer to the paper entitled "Design of Sequential Machines with Fault Detection Capabilities" IEEE Trans. Electronic Computers, Vol. 16 pp. 473–484, August 1967. Informally, dependency of a state variable is the number of other state variables present in the next state logic equation of the state variable. A partition of the states of a machine is a set of disjoint subsets or blocks of the states of the machine. The union of these subsets is the set of all states of the machine. The partition induced by a state variable has the property that all states in a particular block have the same value for that state variable.

Consider the object machine 40 in FIG. 4 and the test machine 20 in FIG. 2. If we encode the states and optimize the logic of the object machine, we get as one implementation the circuit 70 of FIG. 7. Circuit 70 comprises NAND gates 71, 72, 73 and 74, inverters 75 and 76, and flip-flops 77 and 78, interconnected as shown. The state encoding and logic minimization are performed using, for example, MUSTANG and SIS (with NAND-NOR library). The former was described by Devadas et al in IEEE Trans. on Computer-Aided Design Vol 7 pp 1290–1300, Dec. 1988, entitled "Mustang: State Assignment of Finite State Machines Targeting Multilevel Logic Implementations". The latter was described by Sentovich et al in the Proceedings of IEEE International Conference on Computer Design pp 328–333, October 1992 entitled "Sequential Circuit Design Using Synthesis and Optimization." The object machine has two state variables $x_1$ and $x_2$. States $S_1$, $S_2$, $S_3$ and $S_4$ are assigned the binary codes ($x_1=0$, $x_2=1$), ($x_1=1$, $x_2=0$), ($x_1=0$, $x_2=0$) and ($x_1=1$, $x_2=1$), respectively. The dependency graph of the object machine is shown in FIG. 8(*a*). It has a vertex for every state variable in the object machine. If state variable x appears in the next state logic equation of state variable y, then y depends on x and the dependency graph has an arc from vertex x to vertex y. As an example, vertex 1 (2) in FIG. 8(*a*) corresponds to the state variable $x_1$ ($x_2$). There is an arc from vertex 1 to vertex 2 since variable $x_1$ appears in the next state logic equation of state variable $x_2$. The other arcs in the dependency graph and dependency graph 8(*b*) are derived similarly.

For the test machine 20 of FIG. 2, one possible implementation is a shift register. The test machine has two state variables $x'_1$ and $x'_2$. The four states $T_1$, $T_2$, $T_3$ and $T_4$ are encoded as ($x'_1=0$, $x'_2=0$), ($x'_1=0$, $x'_2=1$), ($x'_1=1$, $x'_2=0$) and ($x'_1=1$, $x'_2=1$), respectively. The dependency graph is shown in FIG. 8(*b*).

The key idea is to map the state variables in the test machine to the state variables of the object machine so that the dependency among state variables does not increase. If we map vertices $x'_1$, and $x'_2$ onto $x_1$ and $x_2$, respectively, The dependency among the state variables does not increase. The partition of the states of the object machine according to the state variables is as follows:

$x_1$: {($S_1$, $S_3$) ($S_2$, $S_4$)}

$x_2$: {($S_2$, $S_3$) ($S_1$, $S_4$)}

State variable $x_1$ partitions the four states of the object machine into two blocks. One block consists of states $S_2$ and $S_3$ since $x_1=0$ in the encoding of both states. The second block consists of states $S_1$ and $S_4$ that are encoded as $x_1=1$. Partition $x_2$ is derived similarly.

The partition of test machine states based on state variables is as follows:

$x'_1$: {($T_1$, $T_2$) ($T_3$, $T_4$)}

$x'_2$: {($T_1$, $T_3$) ($T_2$, $T_4$)}

Figure 9:
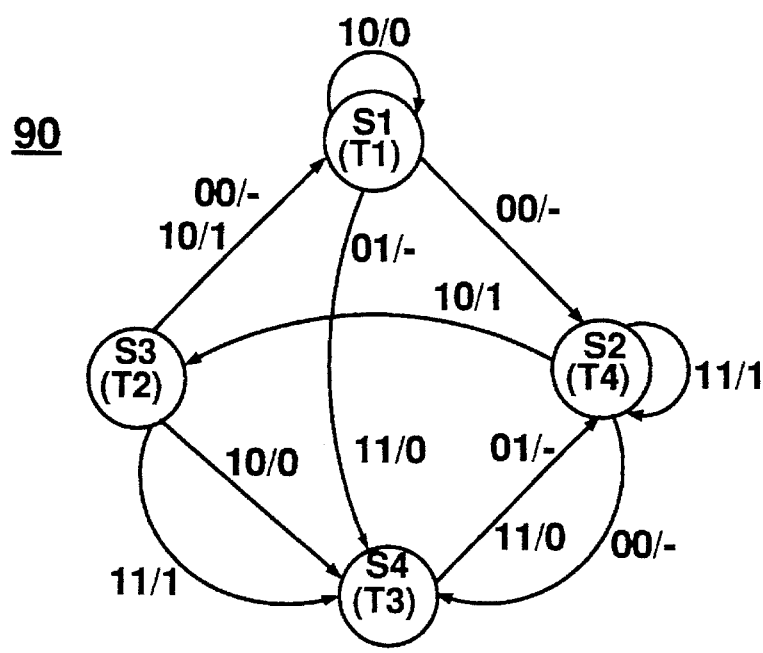
FIG. 9 is a state diagram that will be used in an explanation of embedding.
Figure 10:
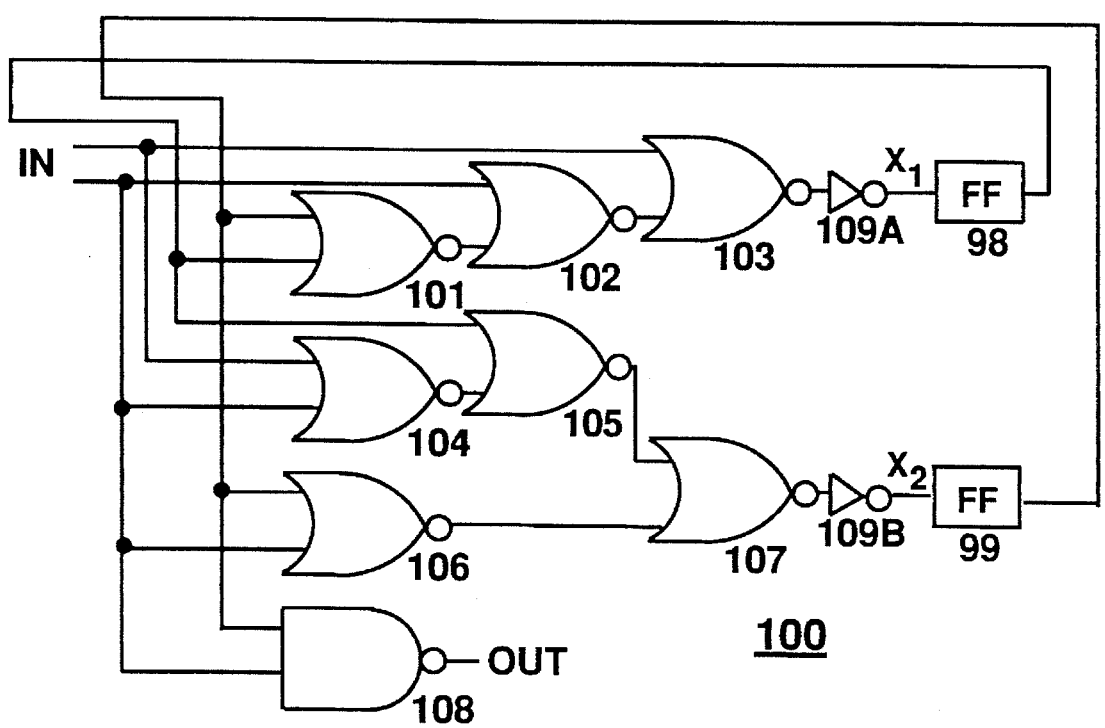
FIG. 10 is a gate-level circuit diagram of a gate-level implementation of the composite machine shown in FIG. 3.

The first block of the partition $x'_1$ can be mapped to the first or second block of the partition $x_1$. Similarly, the first block of the partition $x'_2$ can be mapped to the first or second block of the partition $x_2$. We consider all four possibilities and choose the one that gives minimum logic overhead. Assume that the first block of $x'_1$ is mapped onto the second block of $x'_1$ (therefore, the second block of $x'_1$ maps onto the first block of $x'_1$). Similarly, let the first block of $x'_2$ be mapped onto the first block of $x_2$. Then the mapping of the states of the object and test machines is: $S_1 \rightarrow T_1$, $S_4 \rightarrow T_3$, $S_3 \rightarrow T_2$, $S_2 \rightarrow T_4$. The composite machine state transition graph 90 is shown in FIG. 9. If we perform state encoding and logic optimization using, for example, MUSTANG and SIS, we obtain the composite machine implementation 100 of FIG. 10 that comprises NOR gates 101–107, NAND gate 108, inverters 109A and 109B, and flip-flops 98 and 99 connected as shown. States $S_1$, $S_2$, $S_3$ and $S_4$ are assigned the nodes ($x_1=0$, $x_2=1$), ($x_1=1$, $x_2=0$), ($x_1=0$, $x_2=0$) and ($x_1=1$, $x_{2=1}$), respectively. Presumably, other programs might produce other implementations.

Figure 7:
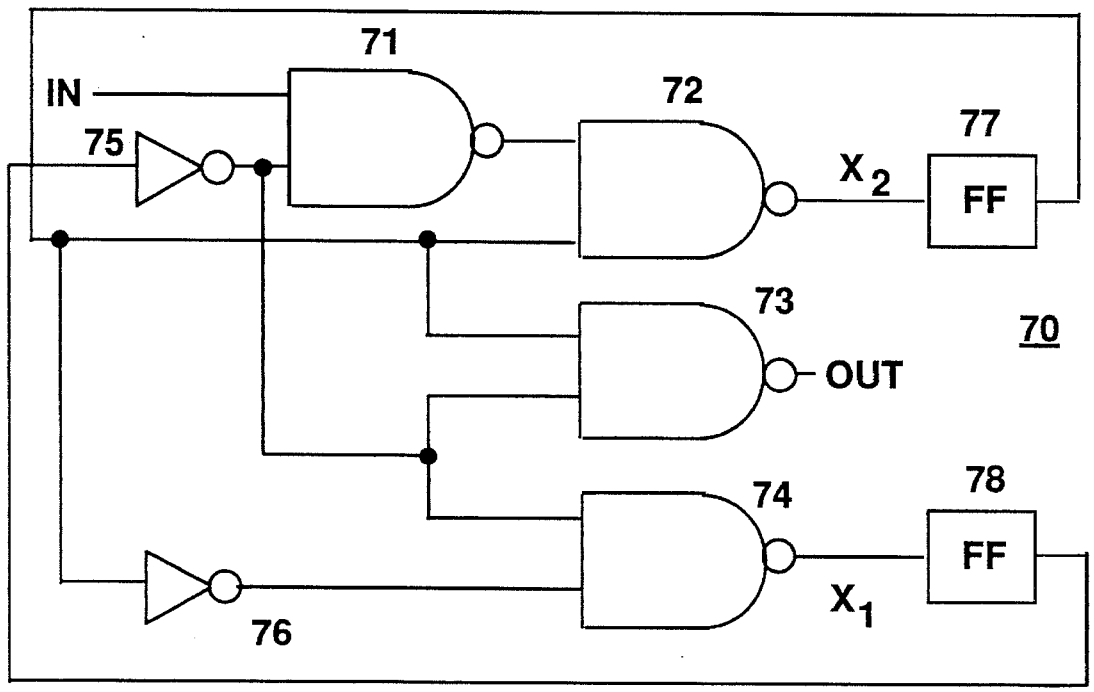
FIG. 7 shows a gate level circuit diagram of a gate level implementation of the object machine of FIG. 1.
Figure 8:
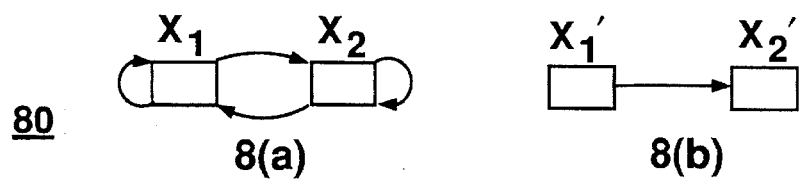
FIGS. 8a and 8b are dependency graphs of the object machine of FIG. 1 and test machine of FIG. 2, respectively.

Post-design scan modifications to the object machine implementation 70 of FIG. 7 will result in a multi-level implementation that has fifteen gates. This is because a multiplexer consisting of three gates is added for each flip-flop and the primary output signal OUT. However, the composite machine 100 in FIG. 10 requires only ten gates.

The test machine states $T_1$, $T_2$, $T_3$ and $T_4$ are encoded as ($x_1=0$, $x_2=1$), ($x_1=0$, $x_2=0$), ($x_1=1$, $x_2=1$) and ($x_1=1$, $x_2=0$). This is because of the mapping of test machine states to the object machine states. Note that this encoding of the test machine does not result in a shift register implementation of the test machine 20 of FIG. 2. This example illustrates the advantage of using a test machine embedding procedure over post-design scan modifications.

Figure 11:
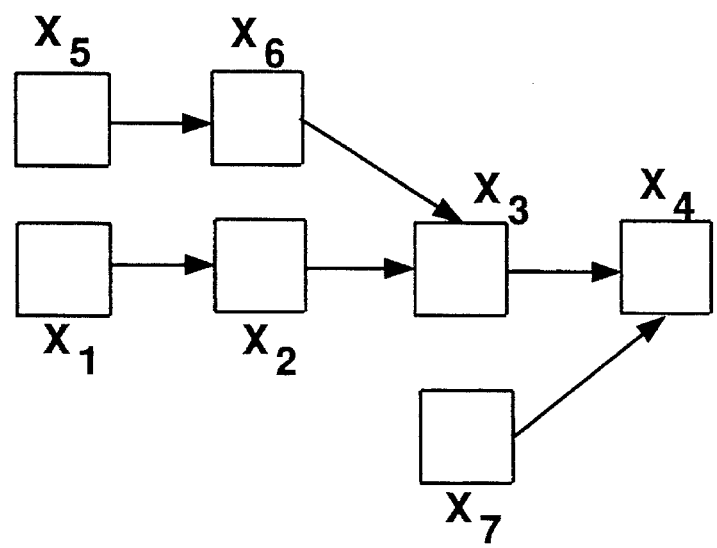
FIG. 11 shows a dependency graph of a typical object machine.

In some cases, it is not possible to map states of the test machine onto the states of the object machine without introducing new dependencies among state variables. Consider an object machine that has seven state variables $x_1$, $x_2$, ..., $x_7$ and a dependency graph 110 as shown in FIG. 11. The corresponding test machine requires seven state variables $x'_1$, $x'_2$, ..., $x'_7$ and it can be implemented to obtain the dependency graph 120 of FIG. 12.

Figure 12:
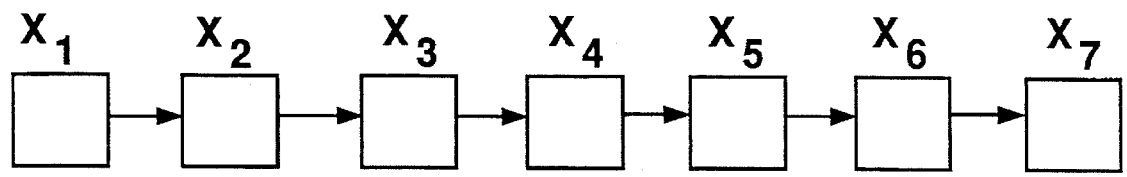
FIG. 12 shows the dependency graph of a test machine that is to be embedded in the object machine represented in FIG. 11.

Note that the graph 110 of FIG. 11 does not have a subgraph that is isomorphic to the dependency graph 120 of FIG. 12.

Therefore, the state variables of FIG. 12 cannot be mapped onto the state variables of FIG. 11 without introducing extra dependencies. The following method maps state variables of the two graphs adding a minimal number of new dependencies:

1. Obtain the longest chain from the dependency graph of the object machine, as described below.
2. Remove the longest chain from the graph. Call this chain the current chain. Add an edge between the head of the current chain and the tail of the chain obtained in the previous iteration of this step, if any. Else, stop.
3. If the modified graph has at least one vertex, go to Step 1.

The problem of finding the longest chain in a directed graph is NP-complete. A heuristic that works well in practice is as follows.

Long chains in the dependency graph can be determined using the following algorithm:

Algorithm B:
1. Compute the strongly connected components of the dependency graph. Replace every strongly connected component by a single vertex and obtain the condensation graph, in known fashion, which is a directed acyclic graph. See for example, "The Design and Analysis of Computer Algorithms", by A. V. Aho et al. Addison Wesley (1974).
2. Compute the longest chain in each strongly connected component. This is an NP-complete problem. One might use the following heuristic: Determine a spanning tree in known fashion, of the strongly connected component. The longest chain in the spanning tree can be determined in time complexity that is linear in the number of vertices and arcs in the strongly connected component.
3. Assign a weight of 1 to every arc in the condensation graph except the arcs that are incident to any strongly connected component vertex. These arcs are assigned a weight equal to the number of vertices in the longest chain in the strongly connected component that they are incident to. The largest weight path in the condensation graph can be determined in time complexity that is linear in the number of vertices. The longest chain for the dependency graph is easily obtained from the largest weight path in the condensation graph.

Figure 13:
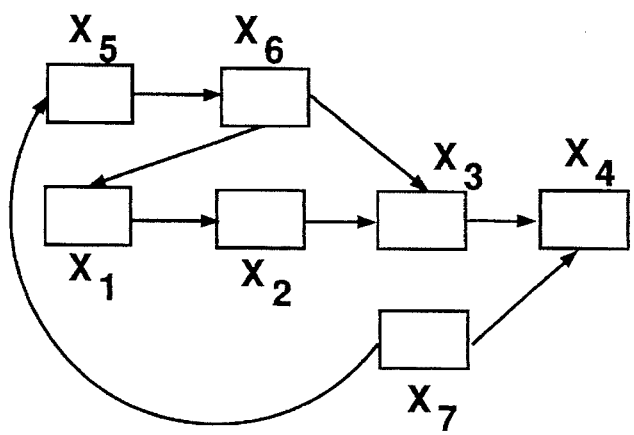
FIG. 13 shows the dependency graph after the test machine of FIG. 12 is embedded in the object machine of FIG. 11.

Steps 2 and 3 can be executed in time complexity that is linear in the size of the graph. The size of the graph reduces in each iteration. Therefore, the number of iterations is linear in number of vertices in the graph. As an example, consider the graph 110 of FIG. 11. In this graph, every vertex is its own strongly connected component. In the first iteration we remove the chain consisting of vertices $x_1$, $x_2$, $x_3$ and $x_4$. In the next iteration, we remove the chain consisting of vertices $x_5$ and $x_6$. We add an edge from vertex $x_6$ to vertex $x_1$. Now, we are left with vertex $x_7$ only and we add an edge from vertex $x_7$ to vertex $v_5$. The modified graph is shown in FIG. 13 and it has the chain $x_7, x_5, x_6, x_1, x_2, x_3, x_4$. The following mapping between state variables of the test and object machine introduces the minimum number of extra dependencies in the composite machine: $x'_1 \rightarrow x_7$, $x'_2 \rightarrow x_5$, $x'_3 \rightarrow x_6$, $x'_4 \rightarrow x_1$, $x'_5 \rightarrow x_2$, $x'_6 \rightarrow x_3$, $x'_7 \rightarrow x_4$ We outline our embedding algorithm for a machine with n states. Without loss of generality, assume that n is a power of two. We need $\log_2 n$ state variables.

Algorithm C:
1. Perform state encoding and logic optimization of the object machine and construct the dependency graph.
2. Chain state variables in the dependency graph of the object machine such that a minimum number of extra edges is added to obtain a subgraph that is isomorphic to the dependency graph of the test machine.
3. Map chains of object and test machine dependency graphs to obtain a mapping of the state variables in the object machine to those in the test machine.
4. Determine two-block partitions induced by state variables of object and test machines.
5. If state variable a in object machine is mapped onto state variable b in test machine, the first block induced by state variable b can go to first or second block of state variable a. In this way, there are $2^{\log_2 n}$, i.e., n possible mappings of the states of the test machine to the states of the object machine. Perform state encoding and logic optimization for each of these mappings and select the implementation with minimum logic.

The above algorithm calls the logic optimizer n times as opposed to n! in an exhaustive search method.

Figure 14:
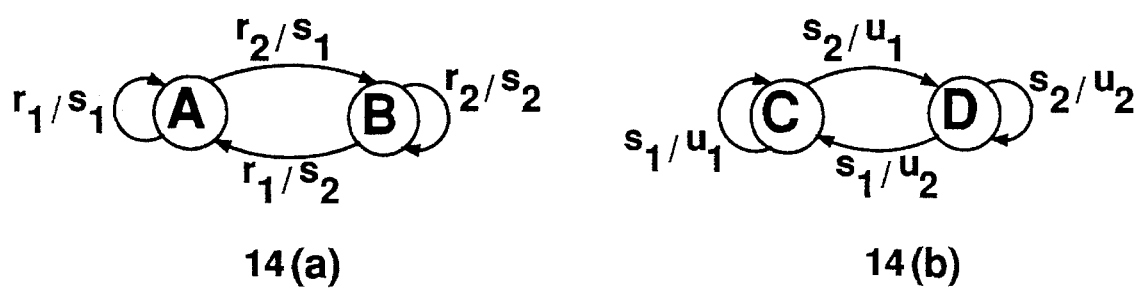
FIG. 14 is an example of the decomposition of a test machine into two test machines.

A valuable property of the test machines that have been described is that they can be decomposed into a collection of smaller test machines that are connected in series. A test machine with $2^n$ states can be split into two series-connected test machines consisting of $2^i$ and $2^{n-i}$ states for any $0 < i < n$. We still have the desirable properties of setting and observing any state by an input sequence of at most n vectors. Consider the four state test machine 20 shown in FIG. 2. It can be decomposed into two test machines 14a and 14b consisting of two states each, as shown in FIG. 14. The output symbols of the first test machine 14a are input symbols of the second test machine 14b. If the first test machine 14a is in state $X_1$ and the second 14b in state $X_2$, we assume that the interconnected test machine is in state $(X_1, X_2)$. The product machine of the two test machines in FIG. 14 is isomorphic to the test machine 20 in FIG. 2 with the mapping $(A,C) \rightarrow T_1$, $(B,C) \rightarrow T_3$, $(A,D) \rightarrow T_2$, $(B,D) \rightarrow T_4$.

Suppose we have two interconnected machines $M_1$ and $M_2$ each having two states. Outputs of $M_1$ drive $M_2$ and vice-versa. A few inputs of $M_1$ are also the primary inputs of the interconnected FSM. Instead of considering $M_1$ and $M_2$ as a single machine and then embedding a four state test machine, we embed the two state test machines 14a and 14b of FIG. 14 separately into each of the two interconnected FSM. Test machine with states A and B embeds into machine $M_1$ and the test machine with states C and D embeds into machine $M_2$. The interconnected machine can be represented as a directed graph with one vertex for every component finite state machine. There is an edge from vertex $M_i$ to vertex $M_j$ if an output of component machine $M_i$ is also an input of component machine $M_j$. The following procedure embeds test machines into the interconnected FSM consisting of component machines $M_1, \ldots, M_k$:

Algorithm D

1. Select a chain consisting of all vertices in the graph of the interconnected machine. If such a chain does not exist, build a chain of all vertices in the graph using a longest chain removal technique like Algorithm B described earlier so that a minimum number of extra edges are added to the graph. We would like to add as few edges as possible because a new edge between $M_i$ and $M_j$ corresponds to addition of an extra input line to the machine $M_j$. Without loss of generality assume that the chain thus formed is $M_2 \rightarrow M_2 \rightarrow M_3 \rightarrow \ldots \rightarrow M_k$.
2. Add an extra input line that is common to all component machines. This line is set to 1 in the test mode and 0 otherwise. An output line of machine $M_j$ is added as a new input line to machine $M_i$ ($1 \leq i,j \leq k$) if Step 1 introduced a new edge from $M_j$ to $M_i$.
3. Embed a test machine in each component machine using the algorithm described earlier. The output symbols of a test machine corresponding to component machine $M_i$ are the input symbols of the test machine corresponding to the immediate successor machine of $M_i$ in the chain formed in Step 1.

Figure 15:
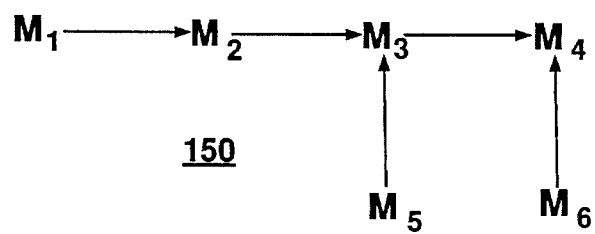
FIG. 15 is a directed graph of an interconnection machine.

Consider the example of an interconnected FSM 150 given in FIG. 15. Machines $M_1, M_2, M_3, M_4, M_5$ and $M_6$ are the component submachines. The number of submachines to be used to achieve the desired interconnection depends on the size of the object machine. Typically, the nature and size of the partitions are chosen after implementation is first made of the object machine in gate level form and the aim is to use enough submachines that unduly large submachines that would involve an unduly large number of states are avoided. Typically there would be avoided machines with more than ten states. Also, assume that outputs of $M_4$ are the only primary outputs of the interconnected machine. An edge from $M_i$ to $M_j$ indicates there are some output lines of $M_i$ that are inputs to $M_j$. An extra input line called the test line is added to all machines. This line is common to all machines. The test line assumes the value 1 in the test mode. Otherwise, it assumes the value 0. A chain is formed from the machines such that a minimum number of extra edges is added to the graph of the interconnected machine. In this example, a possible chain is $M_6 \rightarrow M_5 \rightarrow M_1 \rightarrow M_2 \rightarrow M_3 \rightarrow M_4$. Since there is no edge frown $M_6$ to $M_5$, we add an edge from $M_6$ to $M_5$. Therefore, an output line of $M_6$ is added as an input line to $M_5$. If submachine $M_i$ immediately precedes submachine $M_j$ in the above chain, then the output symbols of the test machine corresponding to $M_i$ are the input symbols of the test machine for $M_j$.

Suppose we have an interconnected machine and the chain of the component machines as obtained by the described procedure is $M_1 \rightarrow M_2 \rightarrow M_3 \rightarrow \ldots \rightarrow M_k$. A suitable test generation procedure for the interconnected machine with embedded test machine consists of the following steps:

1. Generate a suitable combinational test vector for the target fault in the standard fashion. The combinational test generator works on the combinational logic of the entire interconnected machine. Let the combinational test require that the interconnected machine be in state $(s_1, s_2, \ldots, s_k)$ where state $s_j$ is the state of the component machine $M_j$.
2. Apply the synchronizing sequence for the state $(s_1, s_2, \ldots, s_k)$. A procedure to derive the synchronize sequence is given later.
3. Apply the combinational test vector obtained in Step 1
4. Apply a distinguishing sequence. If $p_1$ is an input symbol for machine $M_1$, then a possible distinguishing sequence is $p_1$ repeated s times where $s = \lceil \log_2 t_1 \rceil + \lceil \log_2 t_2 \rceil + \lceil \log_2 t_3 \rceil + \ldots + \lceil \log_2 t_k \rceil$. Here $t_j$ is the number of states of machine $M_j$.

Figure 16:
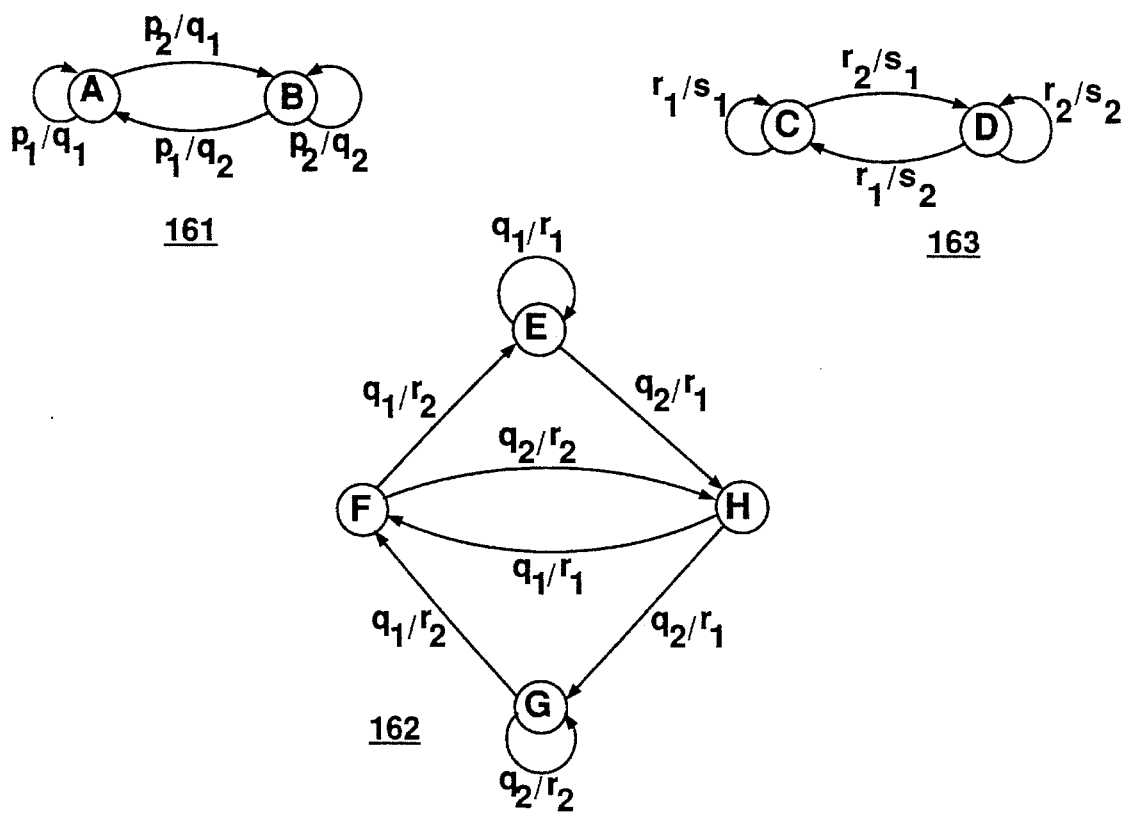
FIG. 16 shows the state diagrams of three test machines that are connected in series.

Step 2 warrants discussion. We know the synchronizing sequence in terms of the inputs of $M_i$ that is necessary to set $M_i$ to state $s_i$. This sequence is also the distinguishing sequence for a group of states $\{s'_{i-1}\}$ of the machine $M_{i-1}$. Therefore, we have to set machine $M_{i-1}$ to any state in $\{s'_{i-1}\}$. The synchronizing sequence for states in $\{s'_{i-1}\}$ is also a distinguishing sequence for a group of states $\{s'_{i-2}\}$ of $M_{i-2}$. In this way, we follow the predecessor machines until we reach $M_1$. Suppose we need to set $M_1$ to state $s'_1$ to finally set $M_i$ to state $s_i$. Let the synchronizing sequence for state $s'_1$ be $z_i$. Following the above method, we determine the sequence necessary to apply at $M_1$ so that machine $M_{i-1}$ is set to state $s_{i-1}$. Let that sequence be $z_{i-1}$. The synchronizing sequence for the state $(s_1, s_2, \ldots, s_k)$ is $z_k, z_{k-1}, \ldots, z_1$. Consider the example in FIG. 16 where the test machine 161 with states A and B feeds into the test machine 162 with states E, F, G and H, that in turn feeds into the test machine 163 with states C and D. Assume that the combinational test requires the interconnection machine to be in the present state (A, H, C). The synchronizing sequence $r_1$ sets machine 163 to the state C. The set of states $\{E, H\}$ have the distinguishing sequence $r_1$. To set machine 162 to any one of the states $\{E, H\}$, the synchronizing sequence is $q_1$., i.e., $q_1 q_2$ or $q_1 q_1$. This can be generated if machine 161 is set to state A and then transferred to state A or state B and the sequence needed is $p_1$. (i.e., $p_1 p_1$ or $p_1 p_2$). To set machine 162 to state H, we need the sequence $q_1 q_2$. Machine 161 is set to state A and then transferred to state B and the sequence needed is $p_1 p_2$. To set machine 161 to state A, we need $p_1$. The synchronizing sequence to set the interconnection machine to state (A, H, C) is $p_1, p_1 p_2, p_1$ which can be compressed to $p_1 p_1 p_2 p_1$. We then apply the combinational test followed by distinguishing sequence, say, $p_1, p_1, p_1,$ and $p_1$.

In a test machine that uses embedding or full-scan design methodology, the correct operation of the test machine or the scan register should be independently insured for high reliability. Faults that do not affect the test machine are detected using the test machine. Since a complete verification of the test machine is impractical, an approximate testing is performed in which every memory element is set to 0 and 1. However, this approach has the following drawback. The test machine may be faulty even if it passes the approximate testing phase. Tests that are generated assuming that the test function is intact, may be invalid. One possible solution is to design the test machine such that it will correctly test the object machine even when the test function is affected by a fault. We can use a similar idea to make the interconnected FSM fault-tolerant. Let $p_1$ and $p_2$ be the input symbols of the test machine. The design guarantees that either transitions labeled $p_1$ or transitions labeled $p_2$ of the test machine remain uncorrupted in the presence of a fault. It is then possible to generate a test sequence that will correctly work even if some test machines are faulty. We can implement each component FSM in the interconnected machine as a two-level PLA (programmable logic array). This technique is described in our paper entitled "Finite State Machine Synthesis with Fault Tolerant Test Function," Journal of Electronic Testing: Theory and Applications, 4, 57–69 (1993). Note that the interconnected machine is still a multi-level implementation which guarantees that either edges labeled $p_1$ or $p_2$ are uncorrupted in the presence of a fault. The length of test sequence for any target fault is still proportional to the total number of state variables in the interconnection machine. Let $M_1, M_2, \ldots, M_k$ be the test machines for an interconnected FSM. Here, $M_i$ is the predecessor of $M_{i+1}$ for $1 \leq i < k$. Assume that the input symbols for $M_i$ are $p^i_1$ and $p^i_2$ and its output symbols are $p^{i+1}_1$ and $p^{i+1}_2$ for $1 \leq i \leq k$. Assume that there is a fault in machine $M_j$ and only transitions labeled $p^i_2$ may be corrupted.

Figure 17:
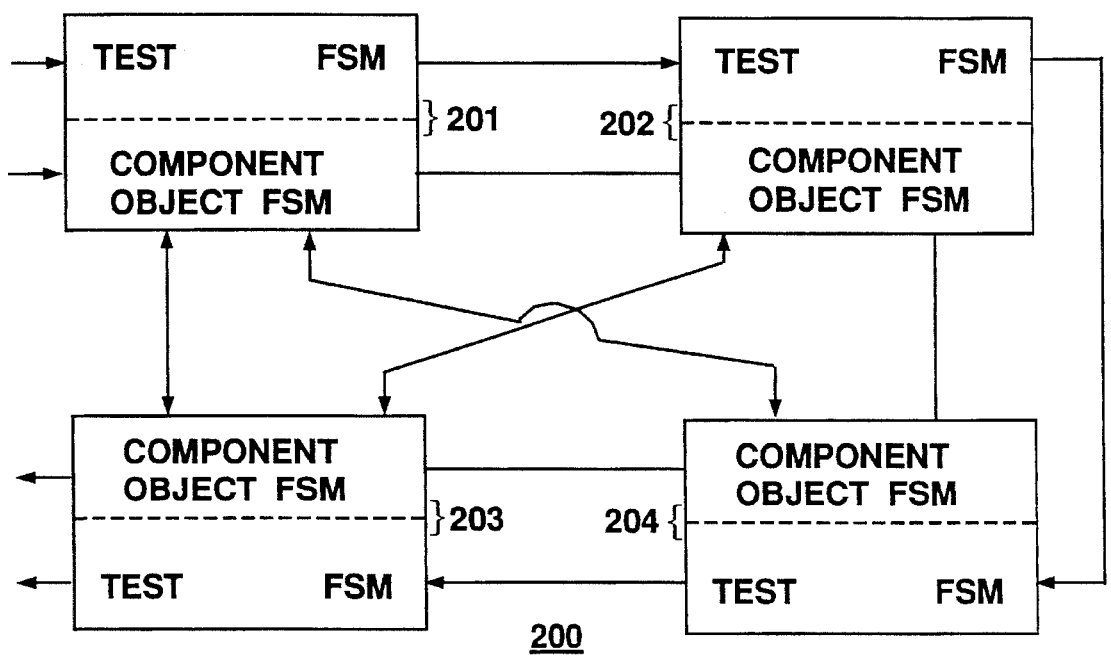
FIG. 17 shows schematically a VLSI circuit which has been segmented into a plurality of finite state machine components in each of which there is embedded a separate test finite state machine.

FIG. 17 shows four components 201, 202, 203, and 204 of the augmented FSM 200 of a VLSI circuit in accordance with an exemplary embodiment of the invention. Typically, the partitioning would involve more than four components. Each composite component includes a portion of the object FSM in which is imbedded a separate test FSM. By application of suitable inputs, the test FSMs are interconnected serially into a circuit that can be used to test the various separate elements of the VLSI circuit.

One observation is worth mentioning. There may be special cases that require an initial reset state. An obvious solution could be to use flip-flops with a reset to handle such cases.

In some instances, it may be preferable to employ the circuit net list rather than a finite state machine design of the object machine. In this case, the following procedure can be used.

Algorithm E:
1. Determine two-block partitions induced by state variables of test machines so that its dependency graph is single chain of flip-flops.
2. Construct the dependency graph from the netlist description of the object machine.
3. Chain state variables in the dependency graph of the object machine such that a minimum number of extra edges is added to obtain a subgraph that is isomorphic to the dependency graph of the test machine.
4. Map chains of object and test machine dependency graphs to obtain a mapping of the state variables in the object machine to those in the test machine.
5. There are "n" possible encodings of the test machine where each will give the same dependency graph of a series chain as each block in the two-block partitions can be coded either 0 or 1. Here; n is the number of states in the object machine. For each such encoding, add these extra functions to the state variables of the object machine by means of an extra test line and multiplexers and then re-optimize logic. Select the implementation with minimum logic.

What is claimed is:

1. A process for designing a finite state object machine for testability comprising the steps of preparing a dependency graph of the finite state object machine;

selecting from the vertices in the dependency graph for forming a chain of component machines representative of the object machine; and embedding a test machine into each component machine such that the output symbols of an embedded test machine are the input symbols of a test machine embedded in the succeeding component machine in the chain, thereby forming a finite state object machine with testability.

2. A VLSI circuit that includes a finite state object machine designed for testability in accordance with the design for testability of claim 1.

3. The process of claim 1 that further includes the step of adding an extra input line common to all component machines.

4. A VLSI circuit that includes a finite state object machine designed for testability in accordance with the design for testability of claim 3.

5. The process of claim 3 in which the selecting step uses the longest chain removal step for forming a chain that requires the addition of the minimum number of extra edges added to the chain.

6. A VLSI circuit that includes a finite state object machine designed for testability in accordance with the design for testability of claim 5.

7. The process of claim 5 further characterized in that there are added the minimum number of edges needed to build such a chain and there is added a new output line to a component machine of the chain to which there was added a new edge in the forming of the chain.

8. A VLSI circuit that includes a finite state object machine designed for testability in accordance with the design for testability of claim 7.

9. The process of chain 7 in which the finite state object machine to be designed for testability is represented by a gate level design.

10. The process of claim 7 in which the finite state object machine to be designed for testability is represented by a circuit netlist design.

* * * * *